United States Patent [19]

Lukes

[11] 4,162,456
[45] Jul. 24, 1979

[54] DIFFERENTIAL AMPLIFYING SYSTEM

[75] Inventor: Henry J. Lukes, Bellevue, Wash.

[73] Assignee: Sundstrand Data Control, Inc., Redmond, Wash.

[21] Appl. No.: 868,427

[22] Filed: Jan. 10, 1978

[51] Int. Cl.$^2$ ............................................. H03F 3/45
[52] U.S. Cl. ........................................ 330/69; 330/84; 330/258
[58] Field of Search ............................ 330/69, 84, 258

[56] References Cited

U.S. PATENT DOCUMENTS 4,047,122 9/1977 Rao ........................................ 330/84

FOREIGN PATENT DOCUMENTS 1334674 10/1973 United Kingdom .................. 330/84 X Primary Examiner—Lawrence J. Dahl
Attorney, Agent, or Firm—Wegner, Stellman, McCord, Wiles & Wood

[57] ABSTRACT

A differential amplifying circuit eliminates the common mode component of a composite signal consisting of the common mode component and a differential component. Two differential amplifiers are coupled to a composite signal source so that one amplifier amplifies only the differential component and transfers the common mode component unchanged. The other amplifier processes the common mode component. The outputs of the differential amplifiers are connected to a voltage divider. The output of the circuit is taken from a tap on this voltage divider at a point where the common mode component is eliminated so that only the amplified differential component remains.

21 Claims, 7 Drawing Figures

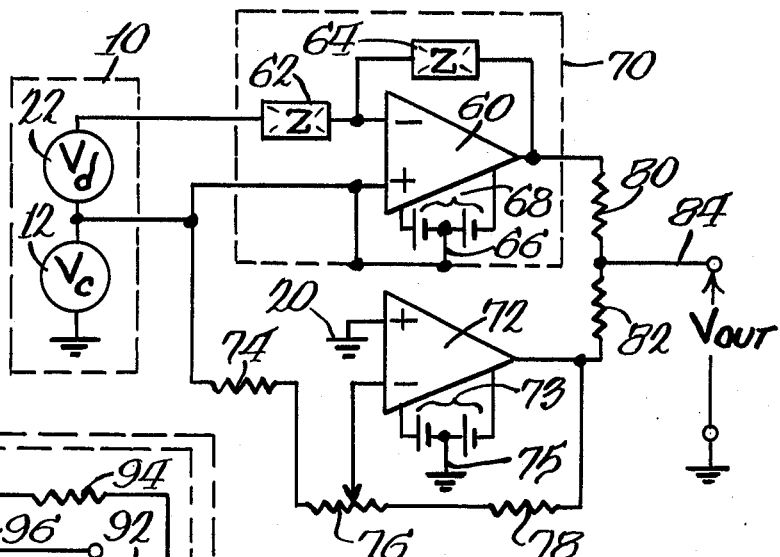
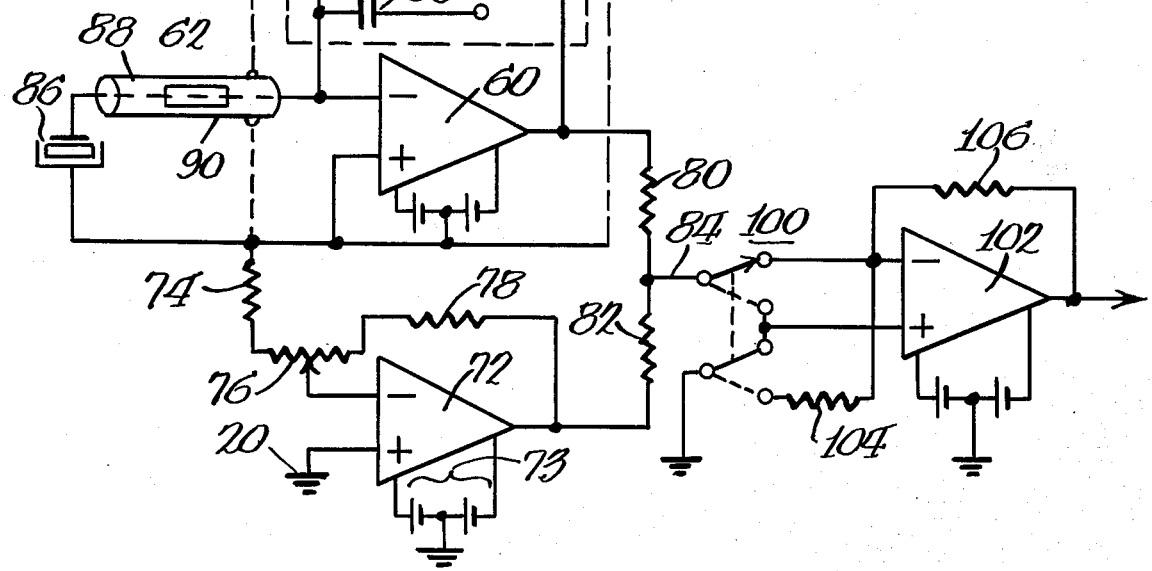
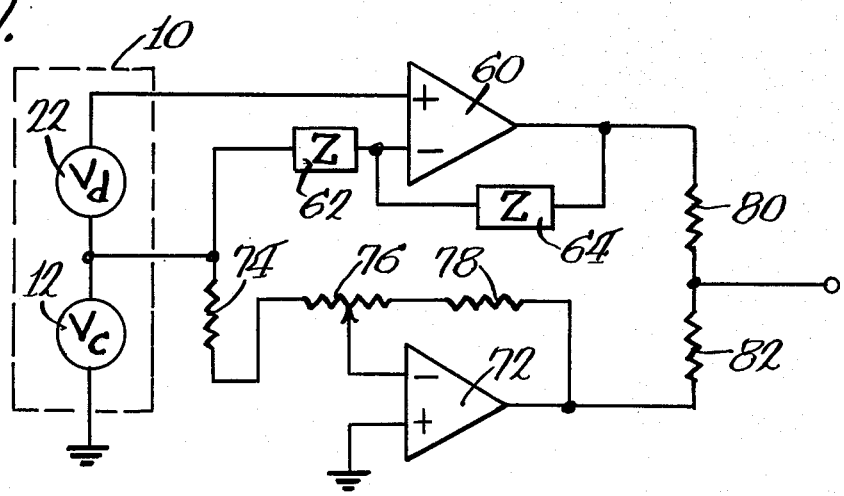

DIFFERENTIAL AMPLIFYING SYSTEM

BACKGROUND OF THE INVENTION

This invention relates to differential amplifying systems and, more particularly, to a system for amplifying a differential component of a composite signal and rejecting the common mode component of the composite signal.

Many differential amplifying configurations have been proposed to amplify the differential component of a weak signal while rejecting the common mode component. Precise impedance relationships must be established in many of the differential amplifying systems known to the prior art. These impedance relationships must be maintained to assure effective operation. Specifically, the impedance difference created by unequal lead lengths to the composite signal source is often enough to disturb the precise impedance relationship so that the common mode component is not fully rejected.

Also, the gain of the differential amplifying systems known to the prior art is not adjustable without additional adjustment of the established impedance relationships. Moreover, the magnitude of the common mode component must be kept smaller than the supply voltage to the differential amplifiers to assure the complete rejection of the common mode component.

SUMMARY OF THE INVENTION

In accordance with the present invention, the above disadvantages are overcome by a circuit for rejecting the common mode component while permitting the differential component to be amplified or processed. The circuit includes a main and an auxiliary amplifier. The inputs of the main differential amplifier are coupled to a signal source which provides a signal having a differential component and a common mode component. The differential component is amplified and the common mode component passes through the main differential amplifier without being amplified. One input of the auxiliary differential amplifier is provided with the common mode component and the other input of the auxiliary differential amplifier is connected to ground. The gain of the auxiliary differential amplifier is selected to attenuate the common mode component by an established value. The outputs of the main and auxiliary amplifiers are applied to a voltage divider. The voltage divider permits the unamplified common mode component from the main amplifier to be subtracted from the common mode component from the auxiliary amplifier. The values of the impedances in the voltage divider are selected so that the common mode component is completely eliminated from the output signal.

DRAWING

FIG. 5 is a schematic diagram of the basic system according to the present invention;

FIG. 6 is a schematic diagram of the preferred embodiment of the system of FIG. 5, with additional circuit details shown;

FIG. 7 is a schematic diagram of a modified form of differential amplifying system embodying the invention wherein the inverting amplifier terminals are connected to a common signal source terminal.

DESCRIPTION OF THE PREFERRED EMBODIMENTS

Figure 1:
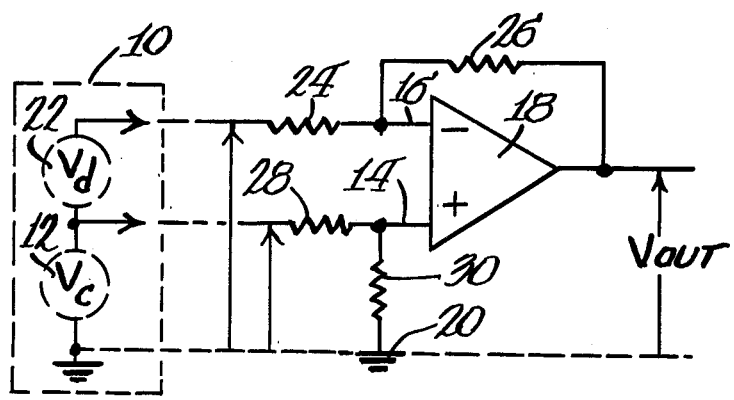
FIGS. 1-3 are schematic diagrams of differential amplifying systems known to the prior art.

Referring to FIG. 1, which shows a prior art system, a composite voltage source 10, schematically shown, includes a common-mode voltage source 12 and a differential voltage source 22, which is connected to inputs 14 and 16. As is well known, the gain of amplifier 18 depends upon whether a signal is applied to the noninverting input 14 or the inverting input 16. If it is desired to amplify the differential component Vd from source 22, and to eliminate the common mode component Vc from source 12, the following relationship must be established between resistors 24, 26, 28 and 30:

$$(R30/R28+R30)=(R26/R24+R26) \quad \text{EQUATION 1}$$

If the above relationship is maintained, the gain for the differential component Vd is $$Vout/Vd=R26/R24 \quad \text{EQUATION 2}$$

and the gain for the common mode component Vc is zero.

Several drawbacks are encountered with the prior art system shown in FIG. 1. If the lead impedances from the composite voltage source 10 to the input terminals 14 and 16 are not the same, the relationship of the resistances, as set forth in Equation 1 above, is no longer exact and the common mode component may not be totally eliminated on the output. Also, for proper amplification of the differential component, the magnitude of the signal from the composite voltage source 10 cannot exceed an established value, as the supply voltage for amplifier 18. Moreover, the amplifier cannot be provided with a selectable gain because the relationship of Equation 1 must be maintained if the common mode voltage is to be rejected on the output.

Figure 2:
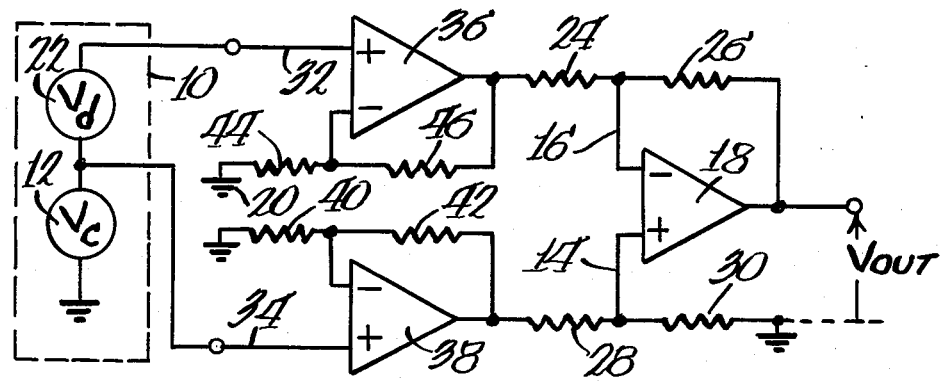

Referring to FIG. 2, another known differential amplifying system having three differential amplifiers is shown. The noninverting inputs 32 and 34 of amplifiers 36 and 38, respectively, are coupled to composite voltage source 10. The values of resistors 40 and 42 are selected to equal the value of resistors 44 and 46, respectively. The outputs of amplifiers 36 and 38 are applied to inputs 14 and 16 of amplifier 18, as discussed in FIG. 1. As a result of amplifiers 36 and 38, the lead resistance from the composite voltage source 10 does not affect the relationship of the resistances 24, 26, 28 and 30. Therefore, asymmetry of the resistance in the leads no longer affects the rejection of the common mode component. However, the other drawbacks, as discussed above, still exist.

Figure 3:
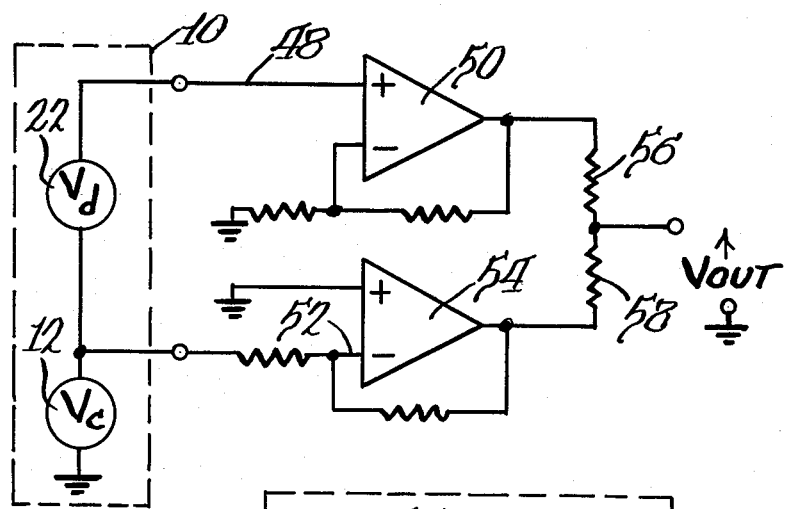

Referring to FIG. 3, another differential amplifying system known to the prior art is shown. Composite voltage source 10 is connected between the noninverting terminal 48 of amplifier 50 and the inverting terminal 52 of amplifier 54. Amplifiers 50 and 54 are provided with the appropriate resistances to establish the desired gain. The outputs of amplifiers 50 and 54 are coupled to a voltage divider consisting of resistors 56 and 58. By selecting the relative values of resistors 56 and 58, the common mode component cancels, leaving the amplified differential component at the output. Thus, any imbalance in resistance due to a difference in the lead length from composite voltage source 10 to amplifiers 50 and 54 can be accounted for by the appropriate selection of resistors 56 and 58 so that the circuit amplifies the differential component and rejects the common mode component. However, the drawbacks discussed above with respect to FIG. 2 are still present in the circuit shown in FIG. 3.

Figure 4:
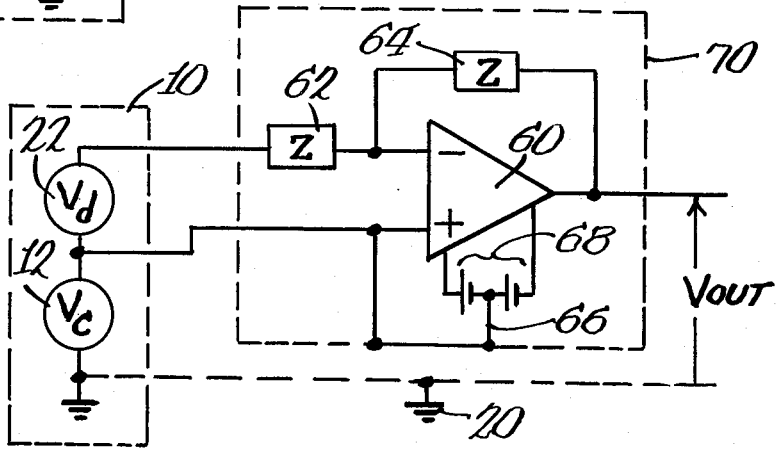
FIG. 4 is a schematic diagram of a portion of the differential amplifying system according to the present invention.

Referring to FIG. 4, an explanation of the function of a main amplifier 60 of the differential amplifying system in accordance with the present invention will now be provided. Composite voltage source 10 is coupled to amplifier 60 so that the differential voltage source 22 is coupled between the inverting and the noninverting terminals thereof and the common mode component source 12 is coupled between one input terminal and ground 20. Impedances 62 and 64 are selected to establish the gain of amplifier 60. Specifically, from well known formulae, which are valid for differential amplifiers having a high open loop gain, the output voltage of an amplifier being driven by its inverting input is $$\text{Vout} = -(Vd + Vc)\, Z64/Z62 \qquad \text{EQUATION 3}$$

When the amplifier is being driven by its noninverting input, the output voltage is $$\text{Vout} = Vc\, |Z64 + Z62/Z62| \qquad \text{EQUATION 4}$$

or $$\text{Vout} = Vc\, |Z64/Z62 + 1| \qquad \text{EQUATION 5}$$

When the amplifier is being driven by both inputs as shown in FIG. 4, the output voltage is $$\text{Vout} = -(Vd + Vc)\left[\frac{Z64}{Z62}\right] + Vc\left[\frac{Z64}{Z62} + 1\right] \qquad \text{EQUATION 6}$$

or, rearranging, $$\text{Vout} = Vc - Vd\, [Z64/Z62] \qquad \text{EQUATION 7}$$

Thus, the gain of amplifier 60, as shown in FIG. 4, is unity for the common mode component Vc from source 12, regardless of the characteristics of the impedances 62 and 64. As is apparent from Equation 7, the unity transfer of the common mode component Vc is not affected by the values or character of impedances 64 and 62; so they can be resistive, reactive or complex, linear or nonlinear or each of them can be of another kind. As a result, this circuit can process the differential component in many different ways; e.g., as a linear or nonlinear amplifier, or as an integrator or differentiator or as a waveform shaping circuit.

It is preferable to connect reference terminal 66 of power supply 68 for amplifier 60 to the composite voltage source 10 rather than connecting reference terminal 66 to ground 20. If the power supply is so connected, amplifier 60 and its power supply 68 float with the common mode component from source 12 thereby permitting the amplifier 60 to operate with large common mode voltage without affecting its function with respect to the differential component. Thus, the amplifier is not responsive to variations in the common mode component, particularly if it is surrounded by electrostatic shield 70 connected to reference terminal 66.

Since the output of amplifier 60 includes the amplified differential component and the unamplified common mode component (see Equation 7), the latter component must be removed so that the output voltage includes only the differential component.

The basic operation of the invention is illustrated in FIG. 5. Referring to FIG. 5, an auxiliary amplifier 72 and its associated resistors 74, 76 and 78 have been added to the circuit identical to that shown in FIG. 4 for removing the common mode component. A voltage divider formed by impedances 80 and 82 is connected between the output of the main amplifier 60 and auxiliary amplifier 72. The noninverting input of amplifier 72 is connected to ground 20. The inverting input is coupled to the common mode component source 12 of composite voltage source 10 through resistors 74 and 76. The ratio of the resistance 78 plus the right-hand portion of potentiometer 76 to the resistances 74 plus the left-hand portion of 76 establishes the gain of amplifier 72.

The important aspect is the fact that the auxiliary amplifier 72 works in such a way that its output common mode component has an opposite polarity with respect to the output common mode component of the main amplifier 60.

Outputs of amplifiers 60 and 72 are connected to the ends of a voltage divider which consists of two impedances of the same character, e.g. of resistors 80 and 82. The output terminal 84 is connected to a top on this voltage divider which is represented by the node between resistors 80 and 82.

By the appropriate selection of resistors 80 and 82, the common mode component from amplifier 60 may be balanced out by the common mode component from amplifier 72. Specifically, if the ratio of resistor 82 to resistor 80 equals the absolute value of the gain of amplifier 72, as established by resistors 74, 76 and 78, the common mode component on output terminal 84 is zero.

If the available output voltage swing of amplifier 72 is smaller than the magnitude of the common voltage from source 12, it is necessary that the absolute value of gain of amplifier 72 be less than unity so that the output voltage therefrom is not clipped. It may be desirable to further amplify the differential component by applying it to another amplifier stage, as will be discussed below.

For proper cancellation of the common mode component it is necessary to avoid any loading of common-mode voltage on the inverting input of the main amplifier 60. Any path conductive for the common-mode voltage, going from the inverting input to ground, would disturb the balance; so, e.g. a capacitance from inverting input to ground would result in a capacitive current to ground which would develop a voltage drop on impedance 64. As a result, the output of amplifier 60 would no longer have the same common-mode voltage as its input; the common-made balance on tap between resistors 80 and 82 would be disturbed and common-mode rejection reduced.

In order to avoid this effect it is only necessary to use an electrostatic shield around the main amplifier 60, or at least around its inverting input and associated components. This shield must be connected to common-mode source, so it has the same common-mode voltage as the whole amplifier; as a result there is no current flowing to this shield from the input, even if there is a considerable capacitance from into shield. Also the input and feedback impedances 62, 64 should be inside this shield.

Illustrated in FIG. 6 is a circuit representing the preferred embodiment of the invention. Here the differential amplifier system is driven by a capacitive transducer 86 which provides a composite signal as discussed above. Capacitive transducer 86 is coupled to the input terminals of a so-called charge amplifier 60 through an interconnecting coax cable 88. The shield 90 of coax cable 88 is secured to electrostatic shield 70. Impedance 62 is represented by the internal capacitance of the transducer 86. The value of impedance 64 is determined by the position of switch 92. Impedance 64 consists of a set of selectable capacitors 96, 97 and 98. In addition, it contains a very high resistor 94 which establishes the position of the operating point. Hence, the gain of amplifier 60 is adjustable over a broad range.

The voltage divider formed by resistors 80 and 82 may be of a selected ratio as, for example, 4:1, and is selected in accordance with the ratio of resistors 74, 76 and 78. Resistor 76 may be in the form of a trim potentiometer for adjusting the gain of amplifier 72 within a very narrow range.

Output 84 may be connected to a two-position switch 100. When switch 100 is in an upper position, amplifier 102 and its associated resistors 104 and 106 provide a gain which, in case that R106=R80, is equal to a negative one. When switch 100 is in a lower position, amplifier 102 provides a gain by an amount equal to $$R104 + R106/R104 \qquad \text{EQUATION 8}$$

If the ratio of resistor 104 to resistor 106 is equal to the ratio of the resistor 82 to resistor 80, amplifier 102 provides an optional polarity inverter which in both positions delivers the same magnitude of output voltage.

The system disclosed herein has many applications in processing a differential component and eliminating a common mode component. Therefore, these applications are not limited to amplifying systems per se. Also, it is apparent that the teachings provided herein also apply to a noninverting configuration of the main differential amplifier, as well as the inverting configuration discussed above.

A noninverting configuration is illustrated in FIG. 7 which differs from the circuit of FIG. 5 primarily in that the inverting input of the auxiliary inverting amplifier 72 is connected to the same terminal of the signal source 10 as the inverting input of the main amplifier 60. Analysis of the circuit of FIG. 7 similar to that provided above for the circuits of FIGS. 5 and 6 will show that it is equally effective in rejecting the common mode portion of a signal.

I claim:

1. A differential signal processing system for eliminating a common mode component of a composite signal comprised of the common mode component and a differential component, said signal being provided by a signal source having a ground terminal and two output terminals separated from the ground terminal, said signal processing system comprising:

a main differential amplifier having inverting and noninverting input terminals, and an output terminal, said noninverting input terminal being operatively connected to one of the signal source output terminals, said inverting input terminal being operatively connected by means of a first input impedance to the other of said signal source output terminals, and a first feedback circuit connecting said differential amplifier output terminal to said inverting input terminal thereof;

an inverting auxiliary amplifier having its inverting input terminal connected by means of a second input impedance to said one signal source output terminal and its noninverting input terminal connected to ground, said auxiliary amplifier including a second feedback circuit connecting the output terminal thereof to said inverting input terminal thereof; and means for combining the output of said main differential amplifier and the output of said auxiliary amplifier effective to provide at an output terminal of said combining means an output signal corresponding to only the differential signal.

2. The system of claim 1 wherein said auxiliary amplifier inverting input terminal is connected to the same signal source output terminal as said main differential amplifier inverting input terminal.

3. The system of claim 1 wherein said auxiliary amplifier inverting input terminal is connected to the same signal source output terminal as said main differential amplifier noninverting input terminal.

4. The system of claim 1 wherein said second feedback circuit includes a resistance.

5. The system of claim 1 wherein said combining means includes a voltage divider connected across said output terminals of said main and auxiliary amplifiers.

6. The system of claim 5 wherein said voltage divider includes two impedances and a tap interposed between said impedances serving as an output terminal for said combining means, wherein the ratio of the value of the impedance connected to said output terminal of said auxiliary amplifier to the value of the impedance connected to the output terminal of said main amplifier is substantially equal to the voltage gain of said auxiliary amplifier.

7. The system of claim 1 wherein said first input impedance is substantially equal to the internal impedance of the signal source.

8. The system of claim 1 wherein said main amplifier includes a power supply and wherein said power supply is connected to the same signal source output terminal as said auxiliary amplifier inverting input terminal.

9. The system of claim 1 additionally including an electrostatic shield enclosing at least a portion of said main amplifier inverting input terminal said shield being connected to the same signal source output terminal as said auxiliary amplifier inverting input terminal.

10. The system of claim 9 wherein said shield encloses said main amplifier.

11. The system of claim 1 wherein the absolute value of the voltage gain of said auxiliary amplifier is less than unity.

12. The system of claim 1 additionally includes a third amplifier connected to the output terminal of said combining means.

13. The system of claim 12 wherein said third amplifier is a differential amplifier and said combining means output terminal is connected to the inverting input of said differential amplifier.

14. The system of claim 12 wherein said third amplifier is a differential amplifier and said combining means output terminal is connected to the noninverting input of said amplifier.

15. The system of claim 14 wherein the gain of said third amplifier is greater than unity.

16. The system of claim 15 wherein said third amplifier gain is selected to compensate for signal attenuation in said combining means.

17. A differential signal processing system for eliminating a common mode component of a composite signal comprised of the common mode component and a differential component, said signal being provided by a signal source having a ground terminal and two output terminals separated from the ground terminal, said signal processing system comprising:
- a main differential amplifier having inverting and noninverting input terminals, and an output terminal, said noninverting input terminal being operatively connected to one of the signal source output terminals, said inverting input terminal being operatively connected by means of a first input impedance to the other of said signal source output terminals, and a first feedback circuit connecting said differential amplifier output terminal to said inverting input terminal thereof;
- an inverting auxiliary amplifier having its inverting input terminal connected by means of a second input impedance to said one signal source output terminal and its noninverting input terminal connected to ground, said auxiliary amplifier including a second feedback circuit connecting the output terminal thereof to said inverting input terminal thereof; and
- a voltage divider including two series connected impedances and a tap connected between said divider impedances, said divider impedances being connected in series between said main differential amplifier and auxiliary amplifier output terminals.

18. The system of claim 17 additionally including an additional differential amplifier having an input connected to said tap.

19. A differential signal processing circuit suitable for use with a signal source comprising:
- a main differential amplifier having inverting and noninverting inputs along with an output terminal wherein said inverting input includes a first impedance connected to a first terminal of the signal source, said noninverting input connected to a second terminal of the signal source and a first feedback circuit connected between said output terminal and said inverting input;
- an auxiliary amplifier having inverting and noninverting inputs along with an output terminal wherein said inverting input includes a second impedance connected to the second signal source terminal and a feedback circuit connecting said output terminal with said inverting input terminal;
- a voltage divider including two impedances and a tap interposed between said divider impedances and when said divider impedances are connected to said main amplifier and auxiliary amplifier output terminals;
- a second differential amplifier having an input connected to said tap; and
- a two position switch connected between said tap and said second differential amplifier effectively to selectively connect the inverting or noninverting inputs of said second differential amplifier to said tap.

20. The circuit of claim 19 wherein said switch is effective to connect a third impedance between the inverting input of said additional differential amplifier and a reference potential when said tap is connected to the noninverting input of said differential amplifier, and a fourth impedance is connected in a feedback circuit between inverting input and the output of said differential amplifier, wherein said voltage divider impedance and said third and fourth impedances are selected to provide an output signal on the output of said differential amplifier having substantially equal value for each position of said switch.

21. A differential signal processing system for eliminating a common mode component of a composite signal comprised of the common mode component and a differential component, said signal being provided by a signal source having a ground terminal and two output terminals separated from the ground terminal, said signal processing system comprising:
- a main differential amplifier having inverting and noninverting input terminals, and an output terminal, said noninverting input terminal being operatively connected to one of the signal source output terminals, said inverting input terminal being operatively connected by means of a first input impedance to the other of said signal source output terminals, and a first feedback circuit connecting said differential amplifier output terminal to said inverting input terminal thereof;
- an inverting auxiliary amplifier having its inverting input terminal connected by means of a second input impedance to said one signal source output terminal and its noninverting input terminal connected to ground, said auxiliary amplifier including a second feedback circuit connecting the output terminal thereof to said inverting input terminal thereof; and
- a voltage divider connected between said main differential and auxiliary amplifier output terminals.

* * * * *